US009057128B2

(12) United States Patent
Olgado

(10) Patent No.: US 9,057,128 B2
(45) Date of Patent: Jun. 16, 2015

(54) MULTIPLE LEVEL SHOWERHEAD DESIGN

(75) Inventor: Donald J. K. Olgado, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 659 days.

(21) Appl. No.: 13/422,824

(22) Filed: Mar. 16, 2012

(65) Prior Publication Data
US 2012/0234945 A1 Sep. 20, 2012

Related U.S. Application Data

(60) Provisional application No. 61/454,067, filed on Mar. 18, 2011.

(51) Int. Cl.
*C23C 16/455* (2006.01)
*B05B 1/00* (2006.01)

(52) U.S. Cl.
CPC ..... *C23C 16/45565* (2013.01); *C23C 16/45572* (2013.01); *B05B 1/005* (2013.01); *C23C 16/45574* (2013.01)

(58) Field of Classification Search
CPC ............... C23C 16/45565; C23C 16/45572; C23C 16/45574; B05B 1/005
USPC ............ 239/548, 553, 553.3, 558, 560; 118/715, 719
See application file for complete search history.

(56) References Cited

U.S. PATENT DOCUMENTS

| 4,851,295 A | 7/1989 | Brors |
| D329,839 S | 9/1992 | Ehrhart |
| 5,273,588 A | 12/1993 | Foster et al. |
| 5,348,911 A | 9/1994 | Jurgensen et al. |
| 5,647,911 A | 7/1997 | Vanell et al. |
| 5,667,592 A | 9/1997 | Boitnott et al. |

(Continued)

FOREIGN PATENT DOCUMENTS

| CN | 1423834 A | 6/2003 |
| GB | 2 219 311 A | 12/1989 |

(Continued)

OTHER PUBLICATIONS

International Search Report and Written Opinion dated Mar. 28, 2012 for International Application No. PCT/US2011/048975.

(Continued)

*Primary Examiner* — Ryan Reis
(74) *Attorney, Agent, or Firm* — Patterson & Sheridan, LLP

(57) ABSTRACT

Embodiments of the present invention generally provide a showerhead assembly made of multiple plates fastened together. The showerhead assembly includes a gas manifold defined by a top and middle plate and a diverter plate defined by the middle plate and a bottom, heat exchange plate. A first processing gas enters the gas manifold and is diverted by the diverter plate through the bottom plate. A second processing gas enters the gas manifold and is diverted by the diverter plate through the bottom plate such that the second and first processing gases do not mix prior to exiting the showerhead. In one embodiment, the first processing gas can be distributed through central and outer regions of the showerhead at different flow rates and/or pressures. In addition, the second processing gas can be distributed through the central and outer regions of the showerhead at different flow rates and/or pressures.

20 Claims, 9 Drawing Sheets

(56) References Cited

U.S. PATENT DOCUMENTS

| | | | |
|---|---|---|---|
| 5,715,361 A | 2/1998 | Moslehi | |
| 5,762,755 A | 6/1998 | McNeilly et al. | |
| 5,814,239 A | 9/1998 | Kaneko et al. | |
| 5,855,675 A | 1/1999 | Doering et al. | |
| 5,858,471 A | 1/1999 | Ray et al. | |
| 5,871,586 A * | 2/1999 | Crawley et al. | 118/715 |
| 5,950,925 A * | 9/1999 | Fukunaga et al. | 239/132.3 |
| 6,086,673 A | 7/2000 | Molnar | |
| 6,156,581 A | 12/2000 | Vaudo et al. | |
| 6,200,893 B1 | 3/2001 | Sneh | |
| 6,206,972 B1 | 3/2001 | Dunham | |
| 6,270,569 B1 | 8/2001 | Shibata et al. | |
| 6,274,495 B1 | 8/2001 | Omstead et al. | |
| 6,302,964 B1 | 10/2001 | Umotoy et al. | |
| 6,305,314 B1 | 10/2001 | Sneh et al. | |
| 6,309,465 B1 | 10/2001 | Jurgensen et al. | |
| 6,387,182 B1 | 5/2002 | Horie et al. | |
| 6,451,119 B2 | 9/2002 | Sneh et al. | |
| 6,451,695 B2 | 9/2002 | Sneh | |
| 6,451,713 B1 | 9/2002 | Tay et al. | |
| 6,464,843 B1 | 10/2002 | Wicker et al. | |
| 6,475,910 B1 | 11/2002 | Sneh | |
| 6,503,330 B1 | 1/2003 | Sneh et al. | |
| 6,508,197 B1 | 1/2003 | Omstead et al. | |
| 6,528,394 B1 | 3/2003 | Lee | |
| 6,540,838 B2 | 4/2003 | Sneh et al. | |
| 6,551,399 B1 | 4/2003 | Sneh et al. | |
| 6,562,720 B2 | 5/2003 | Thilderkvist et al. | |
| 6,562,730 B2 | 5/2003 | Jeng | |
| 6,569,765 B1 | 5/2003 | Solomon et al. | |
| 6,586,886 B1 | 7/2003 | Katz et al. | |
| 6,602,784 B2 | 8/2003 | Sneh | |
| 6,616,766 B2 | 9/2003 | Dunham | |
| 6,616,870 B1 | 9/2003 | Goela et al. | |
| 6,630,401 B2 | 10/2003 | Sneh | |
| 6,638,859 B2 | 10/2003 | Sneh et al. | |
| 6,638,862 B2 | 10/2003 | Sneh | |
| 6,660,083 B2 | 12/2003 | Tsvetkov et al. | |
| 6,733,591 B2 | 5/2004 | Anderson | |
| 6,849,241 B2 * | 2/2005 | Dauelsberg et al. | 423/328.2 |
| 6,884,296 B2 | 4/2005 | Basceri et al. | |
| 6,897,119 B1 | 5/2005 | Sneh et al. | |
| 6,902,990 B2 | 6/2005 | Gottfried et al. | |
| 6,905,547 B1 | 6/2005 | Londergan et al. | |
| 6,921,437 B1 | 7/2005 | DeDontney et al. | |
| 6,927,426 B2 | 8/2005 | Matsuoka et al. | |
| 6,962,624 B2 | 11/2005 | Jurgensen et al. | |
| 6,964,876 B2 | 11/2005 | Heuken | |
| 6,972,050 B2 | 12/2005 | Bremser et al. | |
| 6,983,620 B2 | 1/2006 | Kaeppeler | |
| 7,018,940 B2 | 3/2006 | Dunham | |
| 7,033,921 B2 | 4/2006 | Jurgensen | |
| 7,078,318 B2 | 7/2006 | Jurgensen et al. | |
| 7,103,443 B2 | 9/2006 | Strang | |
| 7,115,896 B2 | 10/2006 | Guo et al. | |
| 7,128,785 B2 | 10/2006 | Kaeppeler et al. | |
| 7,147,718 B2 | 12/2006 | Jurgensen et al. | |
| 7,364,991 B2 | 4/2008 | Bour et al. | |
| 7,368,368 B2 | 5/2008 | Emerson | |
| 7,410,676 B2 | 8/2008 | Kim et al. | |
| 7,625,448 B2 | 12/2009 | Dauelsberg et al. | |
| 7,682,940 B2 | 3/2010 | Ye et al. | |
| 2001/0050059 A1 | 12/2001 | Hongo et al. | |
| 2002/0017243 A1* | 2/2002 | Pyo | 118/715 |
| 2002/0092471 A1 | 7/2002 | Kang et al. | |
| 2004/0221809 A1 | 11/2004 | Ohmi et al. | |
| 2005/0000423 A1* | 1/2005 | Kasai et al. | 118/715 |
| 2006/0021568 A1 | 2/2006 | Matsumoto | |
| 2006/0021574 A1* | 2/2006 | Armour et al. | 118/715 |
| 2006/0154455 A1 | 7/2006 | Guo et al. | |
| 2006/0205199 A1 | 9/2006 | Baker et al. | |
| 2007/0010033 A1 | 1/2007 | Aderhold et al. | |
| 2007/0259502 A1 | 11/2007 | Bour et al. | |
| 2008/0050889 A1 | 2/2008 | Bour et al. | |
| 2008/0206464 A1 | 8/2008 | Kappeler | |
| 2009/0095221 A1 | 4/2009 | Tam et al. | |
| 2009/0095222 A1* | 4/2009 | Tam et al. | 118/723 R |
| 2009/0098276 A1 | 4/2009 | Burrows et al. | |
| 2009/0149008 A1 | 6/2009 | Krylouk et al. | |
| 2009/0194026 A1 | 8/2009 | Burrows et al. | |
| 2009/0211707 A1* | 8/2009 | Chao et al. | 156/345.34 |
| 2010/0272895 A1* | 10/2010 | Tsuda | 427/255.32 |
| 2010/0300359 A1 | 12/2010 | Armour et al. | |
| 2011/0253044 A1 | 10/2011 | Tam et al. | |
| 2011/0256315 A1 | 10/2011 | Tam et al. | |
| 2011/0256645 A1 | 10/2011 | Tam et al. | |
| 2011/0256692 A1 | 10/2011 | Tam et al. | |

FOREIGN PATENT DOCUMENTS

| | | |
|---|---|---|
| JP | 2234419 | 9/1990 |
| JP | 2003-124125 | 4/2003 |
| JP | 2004-140328 A | 5/2004 |
| JP | 2007-154297 A | 6/2007 |
| JP | 2008-066490 A | 3/2008 |
| KR | 10-0578089 B1 | 5/2006 |
| KR | 10-2009-0121498 | 11/2009 |
| KR | 10-2010-0004640 | 1/2010 |
| WO | WO-2009099721 A2 | 8/2009 |

OTHER PUBLICATIONS

International Search Report and Written Opinion dated May 14, 2012 for International Application No. PCT/US2011/058222.

Ban, Vladimir S. "Mass Spectrometric Studies of Vapor-Phase Crystal Growth", vol. 119, Issue 6. pp. 761-765. Jun. 1972.

Bohnen, et al, "Enhanced Growth Rates and Reduced Parasitic Deposition by the Substitution of $Cl_2$ for HCl in GaN HVPE", Journal of Crystal Growth 312 (2010) 2542-2550.

Chinese Office Action for Application No. 200810168234.1 dated Aug. 16, 2010.

Chinoy et al., "A Novel Reactor for Large-Area Epitaxial Solar Cell Materials." Solar Cells, 30 (1991) pp. 323-335.

International Search Report and Written Opinion dated Feb. 10, 2012 for International Application No. PCT/US2011/040335.

International Search Report and Written Opinion dated Feb. 24, 2012 for International Application No. PCT/US2011/043577.

International Search Report, PCT/US2010/030492 dated Oct. 27, 2010.

International Search Report, PCT/US2010/032032 dated Nov. 26, 2010.

International Search Report, PCT/US2010/032313 dated Dec. 6, 2010.

International Search Report, PCT/US2010/032597 dated Dec. 1, 2010.

Kelly, et al. "Large Free-Standing GaN Substrates by Hydride Vapor Phase Epitaxy and Laser-Induced Liftoff", JP Appl. Phys. vol. 38 (1999) pp. L217-L219. Part 2. No. 3A. Mar. 1, 1999.

Kikuchi, et al. "Thermodynamic Analysis of Various Types of Hydride Vapor Phase Epitaxy System for High-Speed Growth of InN", 2006, Japanese Journal of Appiled Physics, vol. 45 No. 45, pp. L1203-L1205.

Motoki, et al. "Preparation of Large Freestanding GaN Substrates by Hydride Vapor Phase Epitaxy Using GaAs as a Starting Substrate", JP Appl. Phys. vol. 40 (2001) pp. L140-L143. Part 2. No. 2B. Feb. 15, 2001.

Office Action, U.S. Appl. No. 11/767,520 dated Sep. 8, 2010.

Office Action, U.S. Appl. No. 11/925,615 dated Nov. 19, 2010.

Park, et al. "Free-Standing GaN Substrates by Hydride Vapor Phase Epitaxy", JP Appl. Phys. vol. 39 (2000) pp. L1141-L1142. Part 2. No. 11B. Nov. 15, 2000.

Vernon et al., "Close-Spaced MOCVD Reactor for 1%-Uniformity Growth of In-Containing Materials on 4" Substrates." pp. 137-140, IEEE Xplore.

* cited by examiner

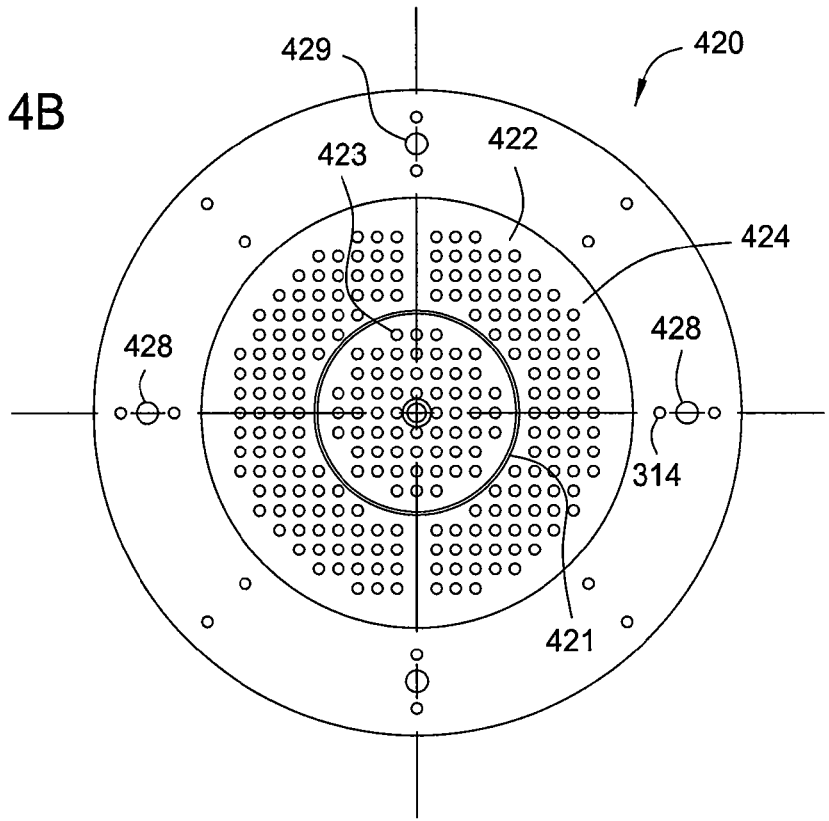
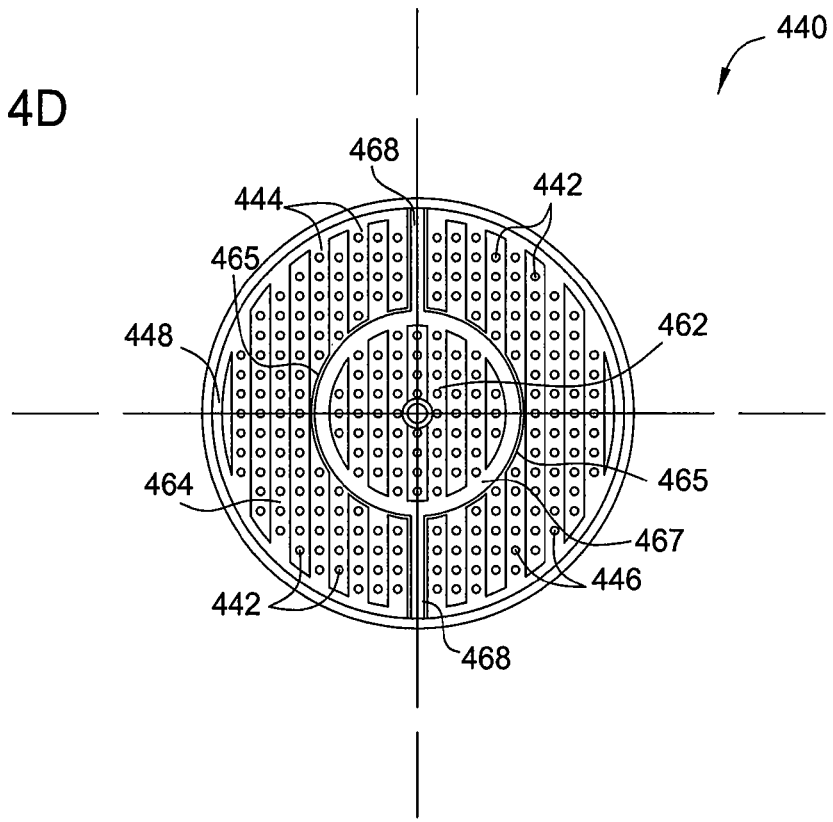

MULTIPLE LEVEL SHOWERHEAD DESIGN

CROSS-REFERENCE TO RELATED APPLICATIONS

This application claims benefit of U.S. provisional patent application Ser. No. 61/454,067, filed Mar. 18, 2011, which is herein incorporated by reference.

BACKGROUND OF THE INVENTION

1. Field of the Invention

Embodiments of the present invention generally relate to apparatus and methods for chemical vapor deposition (CVD) on a substrate, and in particular, to a showerhead assembly made up of multiple plates fastened together for delivering multiple precursors therethrough without mixing prior to exiting the showerhead.

2. Description of the Related Art

Group III-V films are finding greater importance in the development and fabrication of a variety of semiconductor devices, such as short wavelength light emitting diodes (LED's), laser diodes (LD's), and electronic devices including high power, high frequency, high temperature transistors and integrated circuits. For example, short wavelength (e.g., blue/green to ultraviolet) LED's are fabricated using the Group III-nitride semiconducting material gallium nitride (GaN). It has been observed that short wavelength LED's fabricated using GaN can provide significantly greater efficiencies and longer operating lifetimes than short wavelength LED's fabricated using non-nitride semiconducting materials, such as Group II-VI materials.

One method that has been used for depositing Group III-nitrides, such as GaN, is metal organic chemical vapor deposition (MOCVD). This chemical vapor deposition method is generally performed in a reactor having a temperature controlled environment to assure the stability of a first precursor gas which contains at least one element from Group III, such as gallium (Ga). A second precursor gas, such as ammonia ($NH_3$), provides the nitrogen needed to form a Group III-nitride. The two precursor gases are injected into a processing zone within the reactor where they mix and move towards a heated substrate in the processing zone. A carrier gas may be used to assist in the transport of the precursor gases towards the substrate. The precursors react at the surface of the heated substrate to form a Group III-nitride layer, such as GaN, on the substrate surface. The quality of the film depends in part upon deposition uniformity which, in turn, depends upon uniform mixing of the precursors across the substrate at a uniform temperature across the substrate.

Multiple substrates may be arranged on a substrate carrier and each substrate may have a diameter ranging from 50 mm to 100 mm or larger. The uniform mixing of precursors over larger substrates and/or more substrates and larger deposition areas is desirable in order to increase yield and throughput. These factors are important since they directly affect the cost to produce an electronic device and, thus, a device manufacturer's competitiveness in the marketplace.

Interaction of the precursor gases with the hot hardware components, which are often found in the processing zone of an LED or LD forming reactor, generally causes the precursor to break-down and deposit on these hot surfaces. Typically, the hot reactor surfaces are formed by radiation from the heat sources used to heat the substrates. The deposition of the precursor materials on the hot surfaces can be especially problematic when it occurs in or on the precursor distribution components, such as the gas distribution device. Deposition on the precursor distribution components affects the flow distribution uniformity over time. Therefore, the gas distribution device may be cooled during deposition processes, which reduces the likelihood that the MOCVD precursors, or HVPE precursors, are heated to a temperature that causes them to break down and affect the performance of the gas distribution device.

As the desired deposition areas increase, the size and complexity of conventional gas distribution devices that are configured to deliver multiple processing gases to the substrates increases, which results in significantly increased manufacturing and transportation costs. For example, in a multiple precursor gas distribution device, a plurality of manifolds and gas passages may be formed in a number of large plates that are then stacked and permanently attached to form the multiple precursor gas distribution device. As the gas distribution devices increase to cover deposition areas of 1 $m^2$ and greater with the number of gas distribution passages exceeding 5000 in number, the complexity and cost of manufacturing these devices dramatically increases. Therefore, there is a need for an improved gas distribution device to provide improved uniformity in the film subsequently deposited over the larger substrates and larger deposition areas while reducing the complexity and manufacturing cost of the gas distribution device.

SUMMARY OF THE INVENTION

In one embodiment of the present invention, a showerhead assembly comprises a first plate, a second plate coupled to the first plate to form a gas manifold, a third plate coupled to the second plate and having one or more temperature control channels disposed therein, and a fourth plate disposed between the second plate and the third plate. The third plate has a first plurality of gas passages and a second plurality of gas passages formed therethrough. The fourth plate has a plurality of channels formed therein that are fluidly coupled to the second plurality of gas passages in the third plate, and the fourth plate has a plurality of gas passages formed therethrough fluidly coupling the gas manifold with the first plurality of gas passages in the third plate.

In another embodiment, a showerhead assembly comprises a first plate, a second plate coupled to the first plate to form a plurality of gas manifolds, a third plate coupled to the second plate and having one or more temperature control channels disposed therein, and a fourth plate disposed between the second plate and the third plate. The third plate has a first plurality of gas passages and a second plurality of gas passages formed therethrough. The fourth plate has a plurality of channels formed therein that are fluidly coupled to the second plurality of gas passages in the third plate. The fourth plate has a plurality of gas passages formed therethrough fluidly coupling the plurality of gas manifolds with the first plurality of gas passages in the third plate.

In yet another embodiment, a showerhead assembly comprises a first plate, a second plate coupled to the first plate to form a first gas manifold and a second gas manifold, a third plate coupled to the second plate and having one or more temperature control channels disposed therein, and a fourth plate disposed between the second plate and the third plate. The third plate has a first plurality of gas passages and a second plurality of gas passages formed therethrough. The fourth plate has a plurality of channels formed therein that are fluidly coupled to the second plurality of gas passages in the third plate. The fourth plate has a plurality of gas passages formed therethrough fluidly coupled to the first plurality of gas passages in the third plate. The fourth plate has one or more walls separating the plurality of channels and the plurality of gas passages into a first region and a second region. The plurality of gas passages in the first region are fluidly coupled to the first gas manifold and the plurality of gas passages in the second region are fluidly coupled to the second gas manifold.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 4B is a schematic, top view of the middle plate shown in FIG. 4A.

FIG. 4D is a schematic, top view of the diverter plate shown in FIG. 4A.

DETAILED DESCRIPTION

Embodiments of the present invention generally provide a method and apparatus that may be utilized for deposition of films by separately providing multiple precursor gases into a processing region of a processing chamber. Generally, the apparatus is a showerhead assembly made of multiple plates fastened together. The showerhead assembly includes a gas manifold bound by a top and middle plate and a diverter plate bound by the middle plate and a bottom, heat exchange plate. A first processing gas enters the gas manifold and is diverted by the diverter plate through the bottom plate. A second gas enters the gas manifold and is diverted by the diverter plate through the bottom plate such that the first and second gases do not mix prior to exiting the showerhead. In one embodiment, the first processing gas is distributed through central and outer regions of the showerhead at different flow rates and/or pressures. In addition, the second processing gas can be distributed through the central and outer regions of the showerhead at different flow rates and/or pressures.

Figure 1:
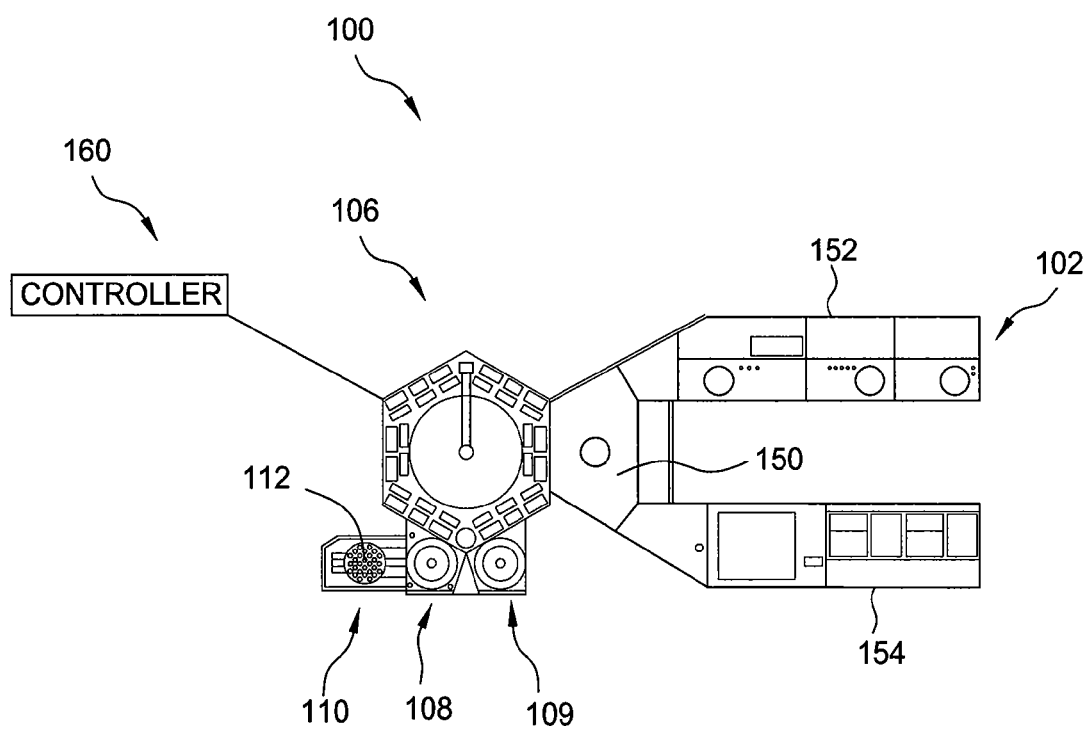
FIG. 1 is a schematic, plan view illustrating a processing system for fabricating compound nitride semiconductor devices according to embodiments described herein.

FIG. 1 is a schematic plan view illustrating one embodiment of a processing system 100 that includes one or more processing chambers 102 for fabricating semiconductor devices according to embodiments described herein. The processing system 100 comprises a transfer chamber 106, a processing chamber 102 coupled with the transfer chamber 106, a loadlock chamber 108 coupled with the transfer chamber 106, a batch loadlock chamber 109, for storing substrates, coupled with the transfer chamber 106, and a load station 110, for loading substrates, coupled with the loadlock chamber 108. The transfer chamber 106 houses a robot assembly (not shown) operable to pick up and transfer substrates between the loadlock chamber 108 and the processing chamber 102. The robot assembly is also operable to transfer substrates from either the processing chamber 102 or the loadlock chamber 108 to the batch loadlock chamber for storing the substrates in the vacuum environment of the processing system 100. Although a single processing chamber 102 is shown, more than one processing chamber 102 may also be coupled with the transfer chamber 106. The processing chamber 102 may be an MOCVD chamber or an HVPE chamber. In addition, although a cluster tool is shown, the embodiments described herein may be performed using linear track systems.

In the processing system 100, the robot assembly (not shown) transfers a substrate carrier plate 112 loaded with substrates into the processing chamber 102 to undergo deposition. After some or all deposition steps have been completed, the substrate carrier plate 112 is transferred from the processing chamber 102 back to the loadlock chamber 108 via the transfer robot. The substrate carrier plate 112 may then be transferred to the load station 110. The substrate carrier plate 112 may be stored in either the loadlock chamber 108 or the batch load lock chamber 109 prior to further processing in the MOCVD chamber 102.

Each processing chamber 102 generally includes a processing chamber body 150 that encloses a processing region where substrates are positioned to undergo processing. Each processing chamber 102 further includes a chemical delivery module 152, from which gas precursors are delivered to the chamber body 150, and an electrical module 154, which includes the electrical system for each processing chamber 102.

A system controller 160 controls activities and operating parameters of the processing system 100. The system controller 160 includes a computer processor and a computer-readable memory coupled to the processor. The processor executes system control software, such as a computer program stored in memory.

Figure 2:
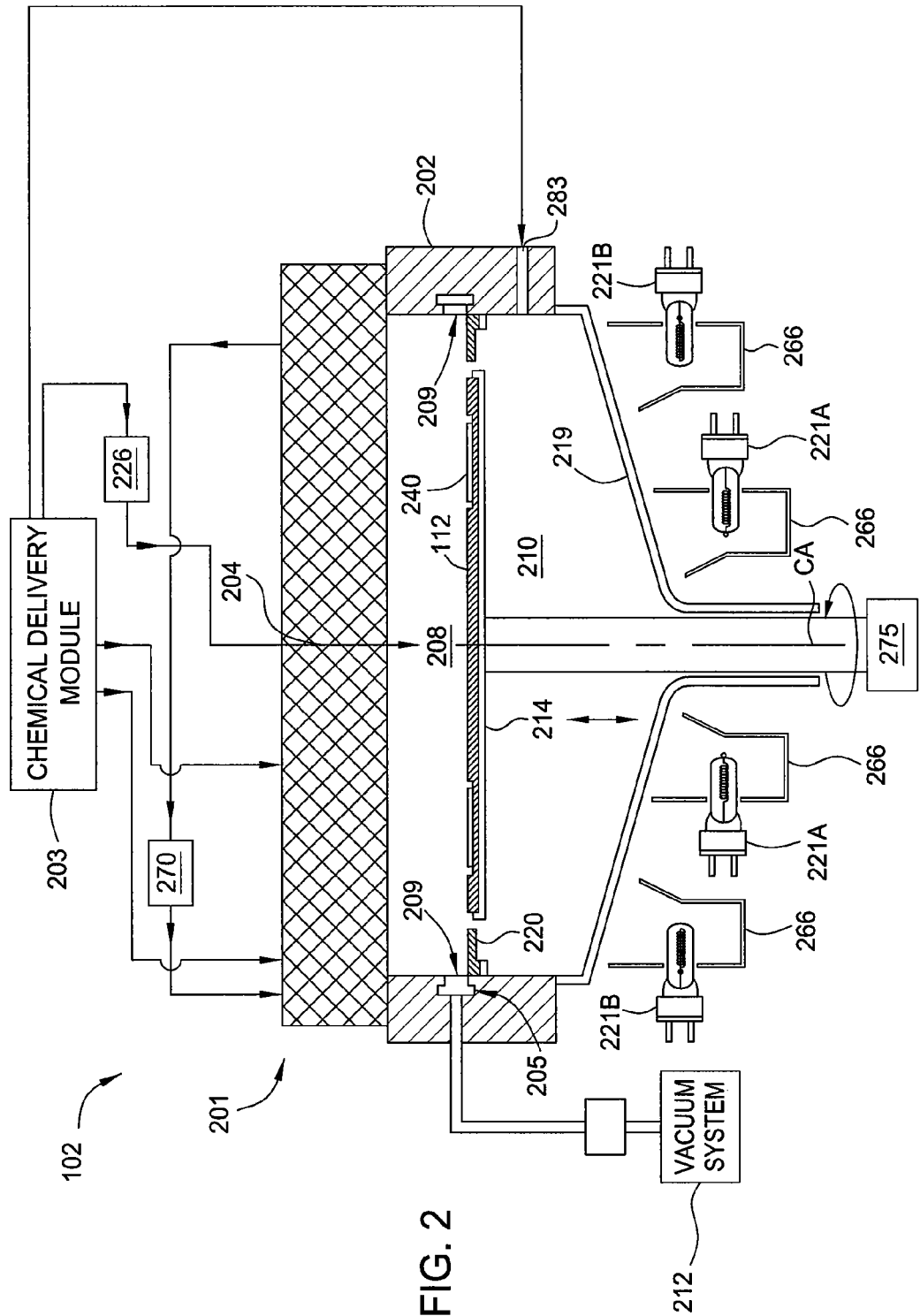
FIG. 2 is a schematic, cross-sectional view of a processing chamber according to one embodiment.

FIG. 2 is a schematic, cross-sectional view of a processing chamber 102 according to one embodiment. The processing chamber 102 includes a chamber body 202 with a showerhead assembly 201 disposed at an upper end of the chamber 102 and a lower dome 219 disposed at a lower end of the chamber 102. Internal details of the showerhead assembly 201 are shown and discussed with respect to FIGS. 3A-C and 4A-D.

A substrate support 214 is disposed within the chamber body 202, such that a processing volume 208 is defined between the substrate support 214, the showerhead assembly 201, and the walls of the chamber body 202. A chemical delivery module 203 is coupled to the showerhead assembly 201 to deliver precursor gases, carrier gases, cleaning gases, and/or purge gases to the processing volume 208. In addition, a heat exchanging system 270 is coupled to the showerhead assembly 201 for flowing heat exchanging fluid through the showerhead assembly 201 to help regulate the temperature of the showerhead assembly 201.

A remote plasma source 226 may be coupled between the chemical delivery module 203 and the showerhead assembly 201. A cleaning conduit 204 may be disposed through the showerhead assembly 201 for delivering a cleaning gas to the processing volume 208. Exemplary cleaning gases are chlorine containing gases, fluorine containing gases, iodine containing gases, bromine containing gases, nitrogen containing gases, and/or other reactive gases. A vacuum system 212 is coupled to the chamber body 202 for evacuating the processing volume 208. During processing, the substrate carrier plate 112 is positioned on the substrate support 214 within the processing volume 208. An actuator assembly 275 is attached to the substrate support 214 and configured to move the substrate support 214 toward and away from the showerhead assembly 201 between processing and loading positions. In addition, the actuator assembly may be configured to rotate the substrate support 214 about a central axis "CA" during processing. The distance from the surface of the showerhead assembly 201 that is adjacent the processing volume 208 to the substrate carrier plate 112, during processing, preferably ranges from about 4 mm to about 41 mm. In certain embodiments, the substrate support 214 has a heating element (e.g., a resistive heating element (not shown)) disposed therein and configured to control the temperature of the substrate support 214 and, consequently, the substrate carrier plate 112 positioned on the substrate support 214 as well as substrates 240 positioned on the substrate carrier plate 112.

A lower volume 210 is defined between the substrate support 214 and the lower dome 219. The substrate support 214 is shown supporting the substrate carrier plate 112 in an elevated processing position, but may be moved to a lower position where, for example the substrate carrier plate 112, along with substrates 240, may be loaded and unloaded. An exhaust ring 220 may be disposed around the periphery of the substrate carrier plate 112 to help prevent deposition from occurring on the lower dome 219 and also help direct exhaust gases from the chamber 102 to exhaust ports 209. The lower dome 219 may be made of transparent material, such as high-purity quartz, to allow light to pass through for radiant heating of the substrates 240. The radiant heating may be provided by a plurality of inner lamps 221A and outer lamps 221B disposed below the lower dome 219. Reflectors 266 may be used to help control exposure of the chamber 102 to the radiant energy provided by the inner and outer lamps 221A, 221B. Additional rings of lamps (not shown) may also be used for finer temperature control of the substrates 240.

A purge gas may be delivered from the chemical delivery module 203 through purge gas tubes 283 disposed near the bottom of the chamber body 202. The purge gas enters the lower volume 210 of the chamber 102 and flows upwardly past the substrate carrier plate 112 and exhaust ring 220 into multiple exhaust ports 209, which are disposed around an annular exhaust channel 205. The upward flow of the purge gas between the substrate support 214 and the exhaust ring 220 helps prevent deposition gases from entering the lower volume 210 and prevent film deposition on the surface of the lower dome 219.

As noted above, the chemical delivery module 203 supplies chemicals to the processing chamber 102. Reactive gases (e.g., precursor gases), carrier gases, purge gases, and cleaning gases may be supplied from the chemical delivery module 203 through supply lines and into the chamber 102. Generally, supply lines for each of the gases include shut-off valves that can be used to automatically or manually shut-off the flow of the gas into its associated line, and mass flow controllers or other types of controllers that measure the flow of gas or liquid through the supply lines. Supply lines for each of the gases may also include concentration monitors for monitoring precursor concentrations and providing real time feedback. Back pressure regulators may be included to control precursor gas concentrations. Valve switching control may be used for quick and accurate valve switching capability. Moisture sensors in the gas lines measure water levels and can provide feedback to the system software which, in turn, can provide warnings/alerts to operators. The gas lines may also be heated to prevent precursors and cleaning gases from condensing in the supply lines.

Figure 3A:
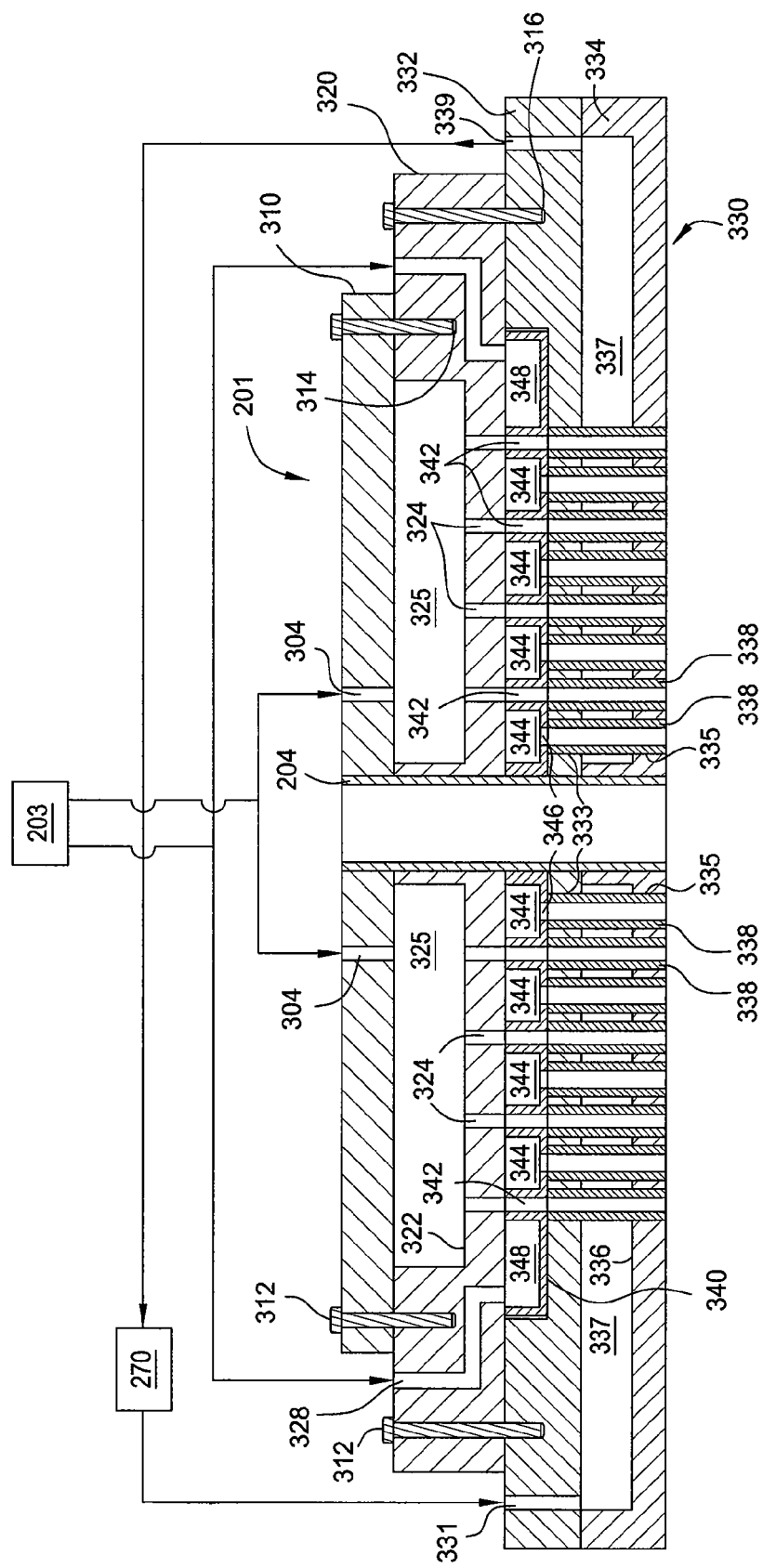
FIG. 3A is a schematic, cross-sectional view of a showerhead according to one embodiment.
Figure 3B:
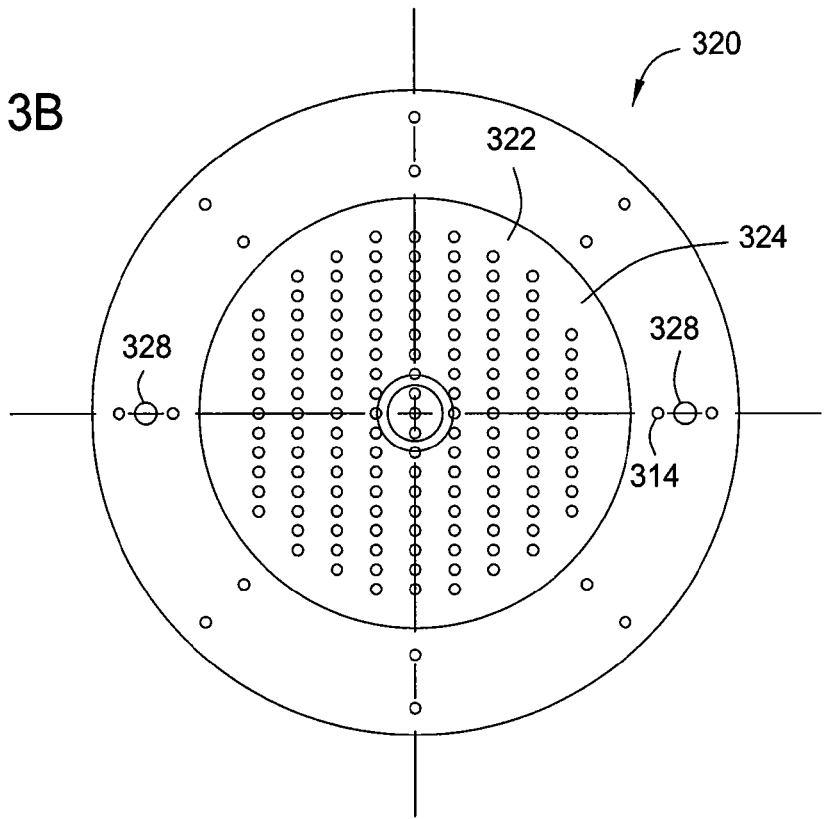
FIG. 3B is a schematic, top view of the middle plate shown in FIG. 3A.
Figure 5:
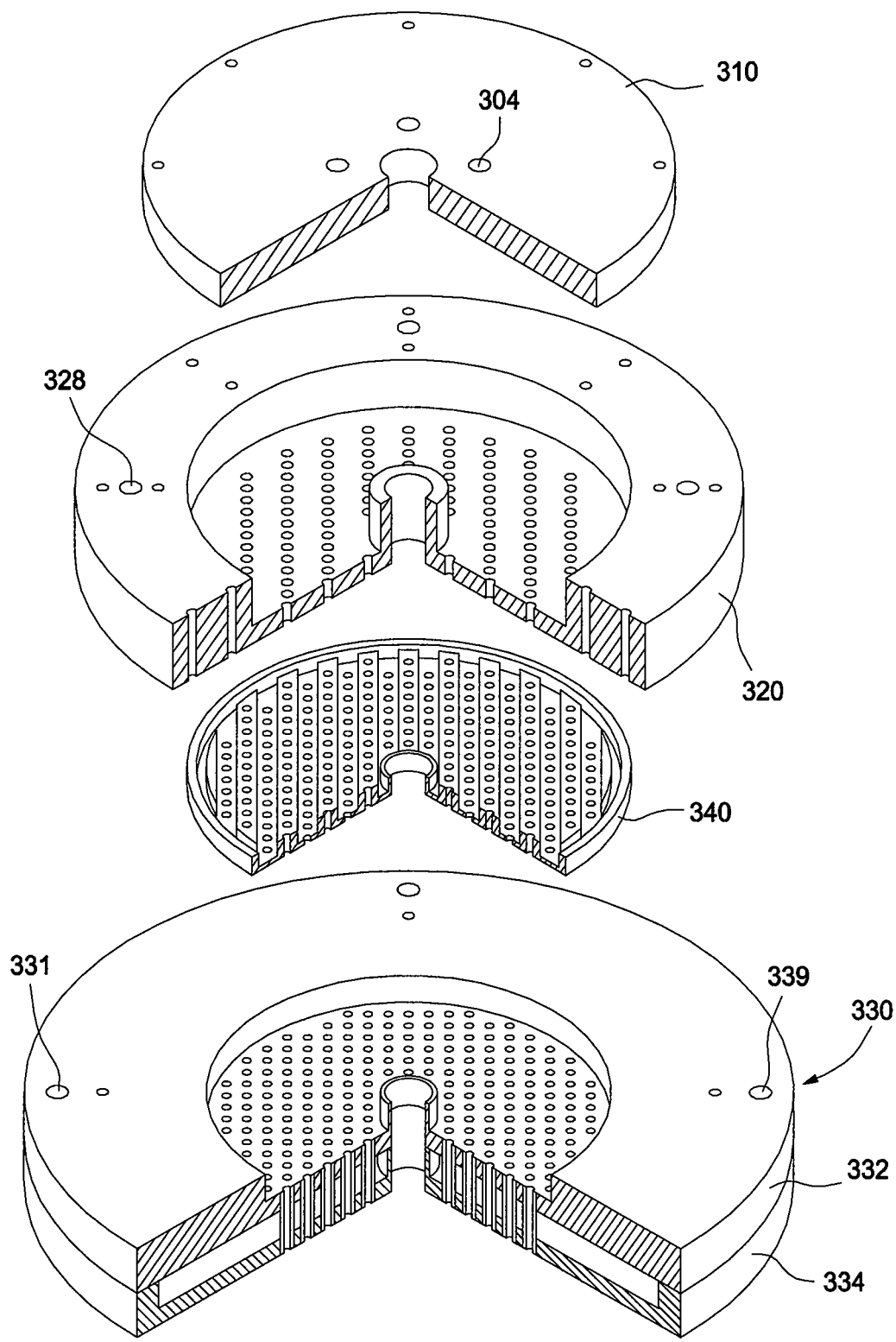
FIG. 5 is an exploded, orthogonal view of the showerhead depicted in FIGS. 3A-3C.

FIG. 3A is a schematic, cross-sectional view of the showerhead 201 according to one embodiment. FIG. 5 is a schematic, exploded, orthogonal view of the showerhead 201 depicted in FIG. 3A. The showerhead assembly 201 includes a top plate 310 coupled to a middle plate 320. A bottom plate 330 is disposed below the middle plate 320. The top plate 310 may be an aluminum or stainless steel plate having one or more gas inlets 304 formed therethrough to deliver a first processing gas into a gas manifold 325 formed between the top plate 310 and the middle plate 320. FIG. 3B is a top view of the middle plate 320 shown in FIG. 3A. The middle plate 320 may be an aluminum or stainless steel plate having a well 322 formed therein and a plurality of gas passages 324 formed therethrough. The plurality of gas passages 324 may be arranged in a plurality of rows as shown. The manifold 325 may be formed by coupling the top plate 310 to the middle plate 320 using a plurality of screws 312 or other suitable fasteners, engaging blind holes 314 in the middle plate 320. The mating surfaces of the top plate 310 and the middle plate 320 may be machined so that when they are attached, a metal-to-metal seal is maintained between the top plate 310 and the middle plate 320 such that fluids entering the manifold 325 are sealed about the periphery of the showerhead assembly 201. Alternatively, other sealing means are used to maintain the fluid seal, such as o-rings.

A first processing gas may be delivered by the chemical delivery module 203 into the gas manifold 325 through the one or more gas inlets 304. The first processing gas mixes in the manifold 325 and exits the manifold 325 through the plurality of gas passages 324. In one example, the first processing gas is a metal organic precursor, such as a suitable gallium (Ga) precursor (e.g., trimethyl gallium (TMG), triethyl gallium (TEG)), a suitable aluminum precursor (e.g., trimethyl aluminum (TMA)), or a suitable indium precursor (e.g., trimethyl indium (TMI)).

As depicted in FIG. 3A, the bottom plate 330 includes a first plate 332 coupled to a second plate 334 having a well 336 formed therein. The first plate 332 may be an aluminum or stainless steel plate having a plurality of holes 333 formed therethrough. The second plate 334 may be an aluminum or stainless steel plate having a plurality of holes 335 formed therethrough, each of which aligns with a respective hole 333. The holes 333, 335 may be arranged in a plurality of rows as shown. A plurality of conduits 338 are disposed within each pair of aligned holes 333, 335 and coupled to the first plate 332 and second plate 334, such as by brazing or welding. The first plate 332 and the second plate 334 are coupled together, such as by brazing or welding, such that a single temperature control channel 337, having the conduits 338 passing therethrough, is formed between the first plate 332 and the second plate 334 and sealed about the periphery of the showerhead assembly 201. In addition, one or more fluid inlets 331 and fluid outlets 339 are formed in the bottom plate 330 fluidly coupling the temperature control channel 337 with an inlet and outlet of the heat exchanging system 270.

A heat exchanging fluid may be delivered from the heat exchanging system 270 into the temperature control channel 337 through the one or more fluid inlets 331. The heat exchanging fluid then circulates through the temperature control channel 337, surrounding the conduits 338. The heat exchanging fluid then exits the temperature control channel 337 through the one or more fluid outlets 339, and returns to the heat exchanging system 270. Suitable heat exchanging fluids include, but are not limited to, water, water-based ethylene glycol mixtures, a perfluoropolyether (e.g., GALDEN® fluid), oil-based thermal transfer fluids, or similar fluids.

Figure 3C:
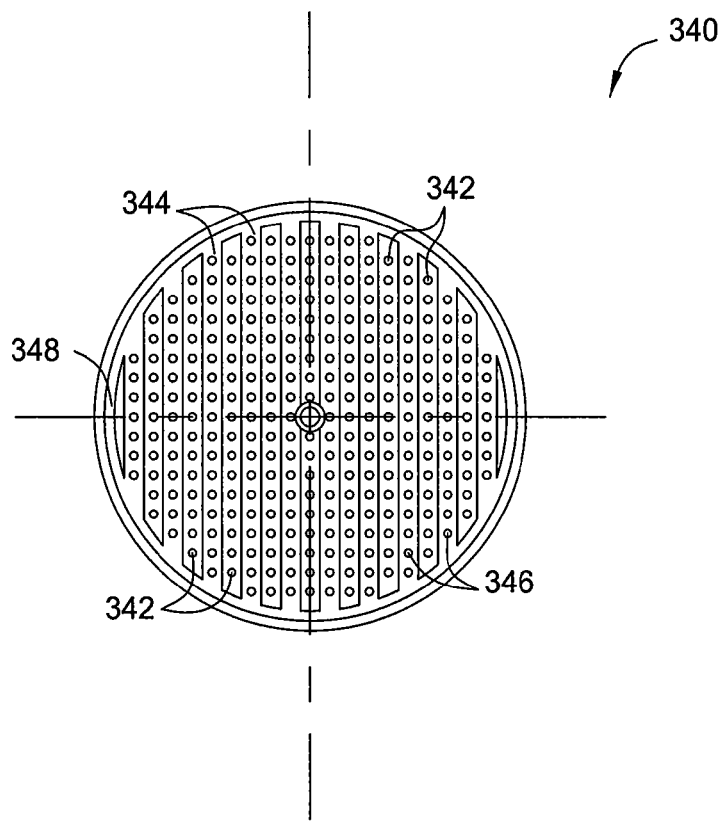
FIG. 3C is a schematic, top view of the diverter plate shown in FIG. 3A.

The showerhead 201 further includes a diverter plate 340 disposed between the middle plate 320 and the bottom plate 330. The diverter plate 340 generally maintains isolation between two separate gases flowing through the showerhead 201. FIG. 3C is a top view of the diverter plate 340 shown in FIG. 3A. The diverter plate 340 may be made of a polymer material (e.g., polytetrafluoroethylene (PTFE), fluorinated ethylene propylene (FEP), polyvinylidene fluoride (PVDF), polyethylene (PE)) or a metal, such as aluminum or stainless steel. The diverter plate 340 includes a plurality of first gas passages 342 disposed therethrough and aligned with the gas passages 324 and a number of the conduits 338. The first gas passages 342 may be aligned in a plurality of rows matching the rows of the gas passages 324 in the middle plate 320 as shown. The rows of first gas passages 342 may be further aligned with alternate rows of the conduits 338.

Additionally, channels 344 are formed in the diverter plate 340 between adjacent rows of the first gas passages 342. A plurality of second gas passages 346 are formed through the diverter plate 340 within each of the channels 344, which are aligned with alternate rows of the conduits 338. The diverter plate 340 further includes a perimeter channel 348 disposed about the periphery of the diverter plate 340 and in fluid communication with each of the channels 344. In addition, the middle plate 320 includes one or more gas inlets 328 disposed therethrough for delivering a second processing gas from the chemical delivery module 203 into the perimeter channel 348.

The middle plate 320 and the bottom plate 330 are coupled together using a plurality of screws 312 or other suitable fasteners, engaging blind holes 316 in the bottom plate 330. The mating surfaces of the middle plate 320 and the bottom plate 330 may be machined so that when they are attached, a metal-to-metal seal is maintained between the middle plate 320 and the bottom plate 330 such that fluids entering the perimeter channel 348 are sealed about the periphery of the showerhead assembly 201. Alternatively, other sealing means are used to maintain the fluid seal, such as o-rings.

A second processing gas may be delivered by the chemical delivery module 203 into the perimeter channel 348 through the one or more gas inlets 328. The second processing gas is distributed from the perimeter channel 348 to the channels 344 and is delivered through the second plurality of gas passages 346. In one example, the second processing gas is a suitable nitrogen-containing processing gas, such as ammonia (NH$_3$) or other MOCVD or HVPE processing gas.

The diverter plate 340 is sandwiched between the middle plate 320 and the bottom plate 330. The diverter plate 340 may be formed such that the mating surfaces between the diverter plate 340 and the middle plate 320 as well as the mating surfaces between the diverter plate 340 and the bottom plate 330 form a surface-to-surface seal, such that fluids delivered from the gas manifold 325 through the first gas passages 342 are not mixed with fluids delivered to the perimeter channel 348 and through the second gas passages 346 prior to delivery through the respective conduits 338. Alternatively, other sealing means are used to maintain the fluid seal, such as o-rings.

Referring to FIGS. 2 and 3A, a first processing gas, such as a metal organic precursor, may be delivered to the gas manifold 325 from the chemical delivery module 203 through the one or more gas inlets 304. The first processing gas is then delivered from the gas manifold 325 through the plurality of gas passages 324 in the middle plate, and through the first gas passages 342 in the diverter plate 340. The first processing gas is then delivered through the conduits 338 aligned with the first gas passages 342 and into the processing volume 208.

Substantially simultaneously, a second processing gas, such as a nitrogen precursor, may be delivered into the perimeter channel 348 from the chemical delivery module 203 through the one or more gas inlets 328. The second processing gas is distributed from the perimeter channel 348 to the channels 344 and through the second plurality of gas passages 346 in the middle plate 320. The second processing gas is then delivered through the conduits 338 aligned with the second gas passages 346 and into the processing volume 208 without mixing with the first processing gas prior to delivery into the processing volume 208.

At the same time the first and second processing gases are being delivered through the showerhead 201 and into the processing volume 208, a heat exchanging fluid may be delivered from the heat exchanging system 270 into the temperature control channel 337 through the one or more fluid inlets 331 in the bottom plate 330. The heat exchanging fluid circulates through the temperature control channel 337, cooling the first and second processing gases as well as the surface of the bottom plate 330 facing the processing volume 208. The heat exchanging fluid then exits the temperature control channel 337 through the one or more fluid outlets 339, and returns to the heat exchanging system 270.

Figure 4A:
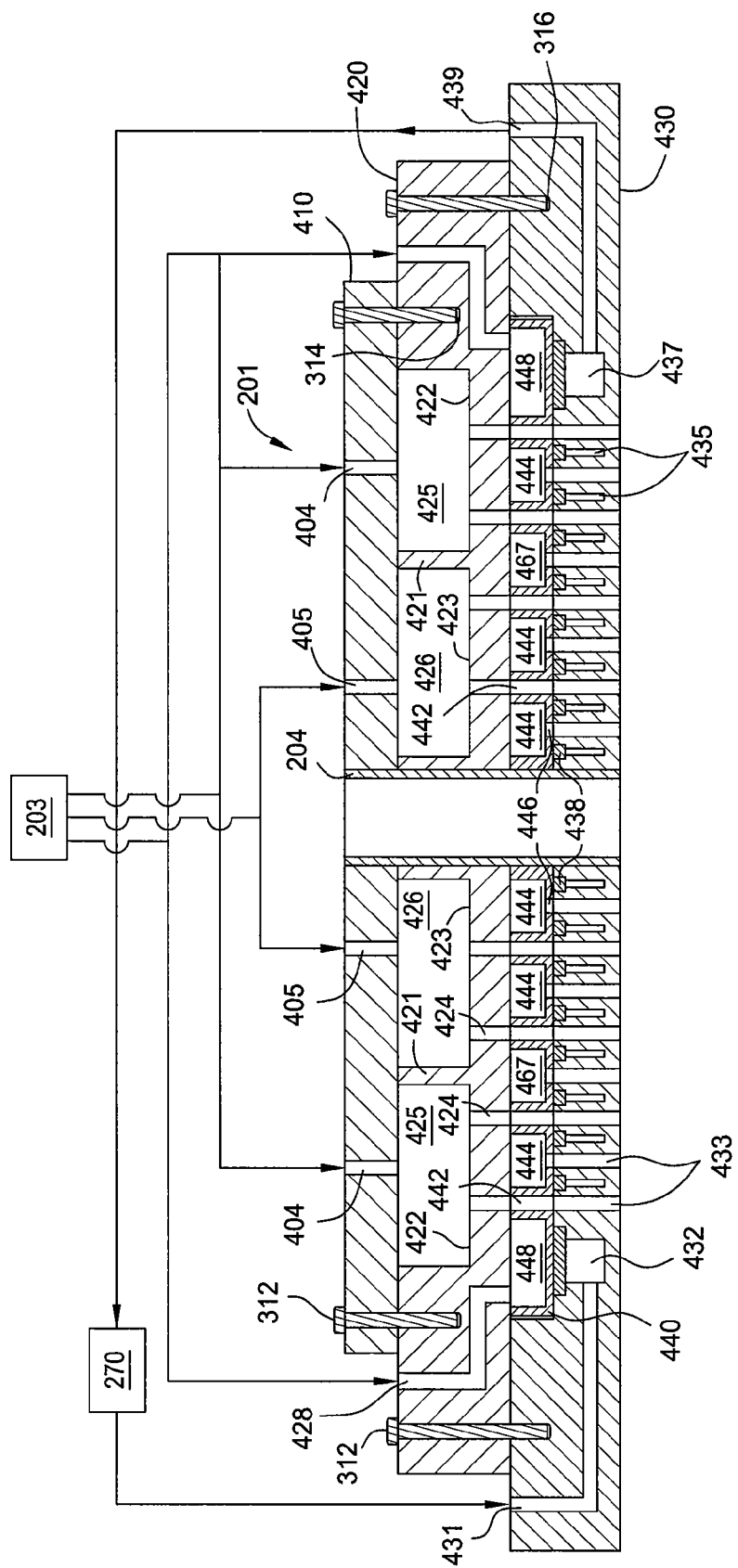
FIG. 4A is a schematic, cross-sectional view of a showerhead according to another embodiment.
Figure 6:
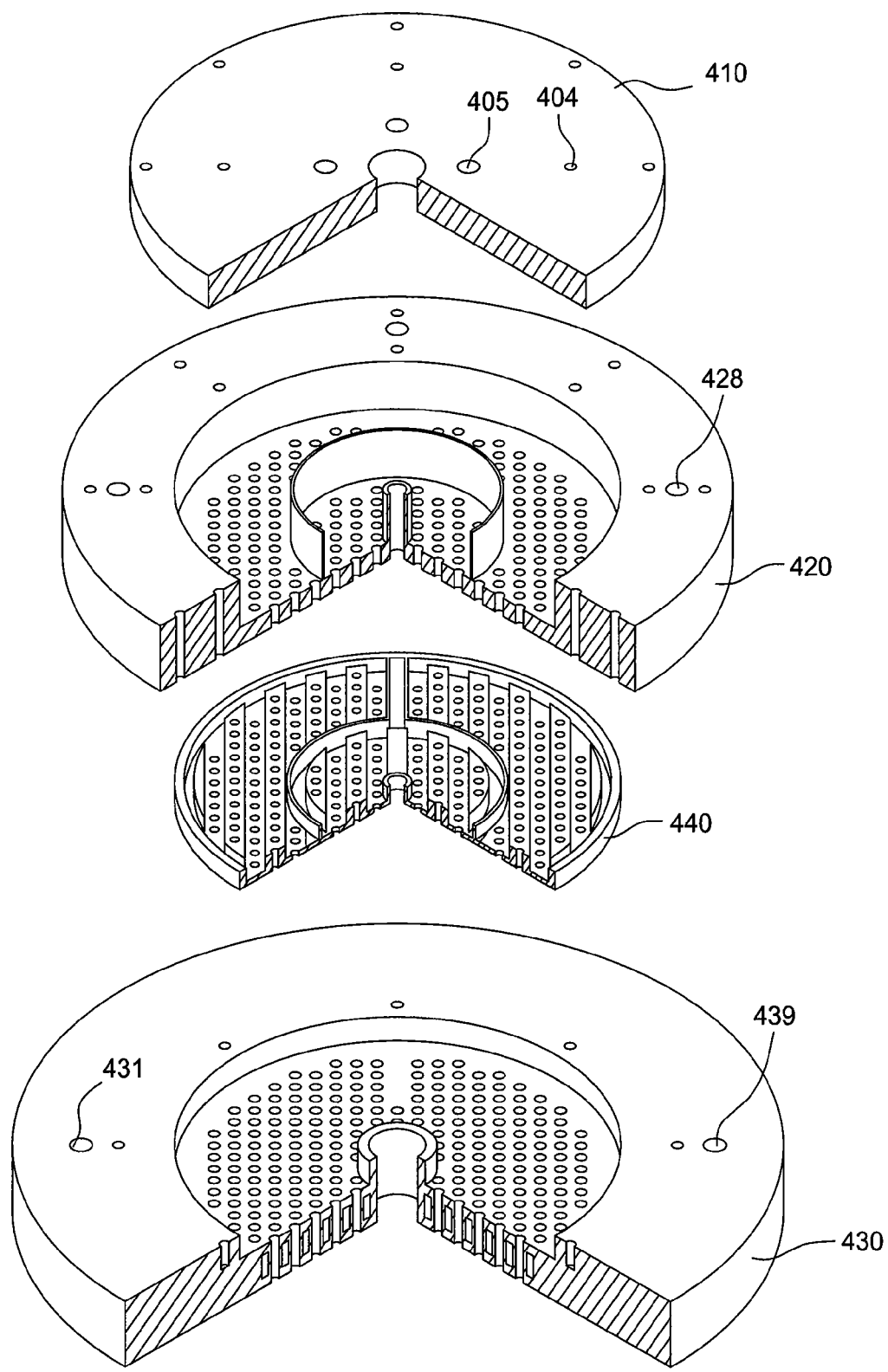
FIG. 6 is an exploded, orthogonal view of the showerhead depicted in FIGS. 4A-4D.

FIG. 4A is a schematic, cross-sectional view of the showerhead 201 according to another embodiment. FIG. 6 is a schematic, exploded, orthogonal view of the showerhead 201 depicted in FIG. 4A. Many of the features of the embodiment shown in FIG. 4A are the same as those shown in and described with respect to FIG. 3A and are not further described here. As shown in FIG. 4A, a top plate 410 includes one or more outer gas inlets 404 formed therethrough to deliver a processing gas into an outer gas manifold 425, and one or more inner gas inlets 405 formed therethrough to separately deliver the same or a different processing gas into an inner gas manifold 426. In one embodiment, the same processing gas is delivered at different flow rates and/or pressures to the outer gas manifold 425 and inner gas manifold 426.

FIG. 4B is a top view of a middle plate 420 shown in FIG. 4A. The middle plate 420 has an outer well 422 and an inner well 423 formed therein and separated by an annular wall 421. Gas passages 424 formed through the middle plate 420 may be arranged in a plurality of rows. The outer and inner gas manifolds 425, 426 are formed by coupling the top plate 410 to the middle plate 420 using a plurality of screws 312, or other suitable fasteners as previously described. The mating surfaces of the top plate 410 and the middle plate 420 may be machined so that when they are attached, a metal-to-metal seal is maintained between the top plate 410 and the middle plate 420 such that fluids entering the inner gas manifold 426 are sealed from those entering the outer gas manifold 425 and vice versa. In addition, fluids entering the outer gas manifold 425 are sealed about the periphery of the showerhead assembly 201. Alternatively, other sealing means are used to maintain the fluid seal, such as o-rings.

A first processing gas may be delivered by the chemical delivery module 203 into the outer gas manifold 425 through the one or more gas inlets 404 at a first flow rate and/or pressure. The same or a different processing gas may be delivered by the chemical delivery module 203 into the inner gas manifold 426 through the one or more gas inlets 405 at a second flow rate and/or pressure different than the first flow rate and/or pressure.

Figure 4C:
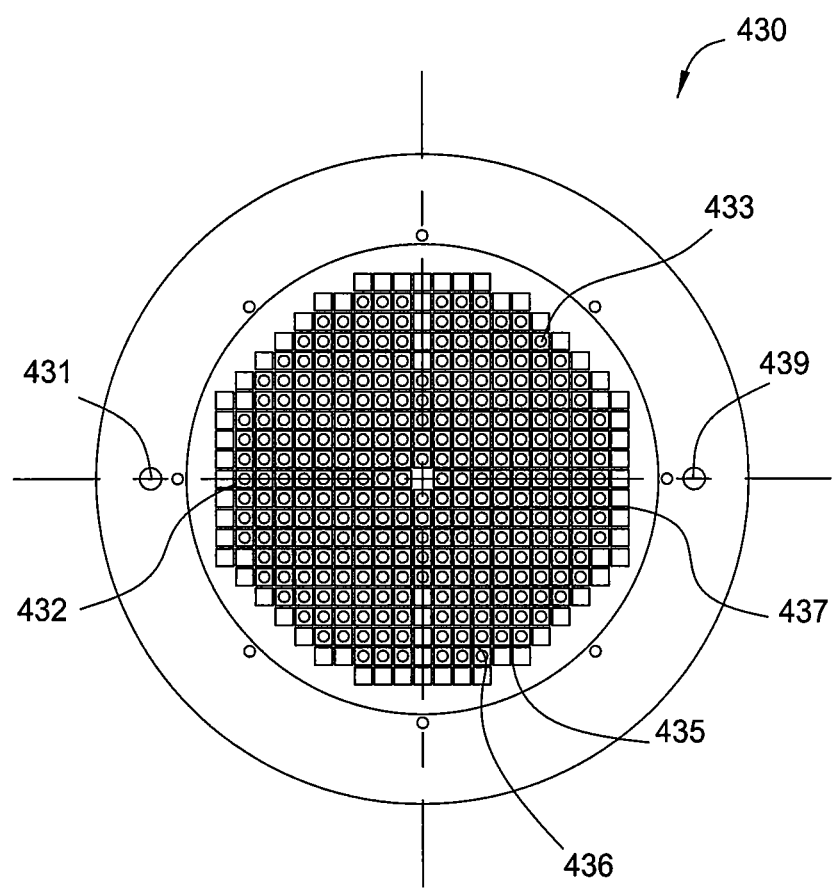
FIG. 4C is a schematic, top view of the bottom plate shown in FIG. 4A.

As depicted in FIG. 4A, a bottom plate 430 is manufactured from a single aluminum or stainless steel plate. FIG. 4C is a top view of the bottom plate 430 shown in FIG. 4A. The bottom plate 430 shown in FIGS. 4A and 4C has a plurality of gas passages 433 formed therethrough, which may be arranged in a plurality of rows as shown. The bottom plate 430 further has a plurality of temperature control channels 435 formed between the rows of gas passages 433. The bottom plate 430 may also have a plurality of cross-channels 436 formed between the gas passages 433 in a direction substantially perpendicular to the direction of the temperature control channels 435 and in fluid communication with the temperature control channels 435 as shown in FIG. 4C. In addition, one or more supply channels 432 and one or more return channels 437 are formed in the bottom plate 430, which are in fluid communication with the temperature control channels 435 and/or the cross-channels 436. The temperature control channels 435, cross-channels 436, supply channels 432, and return channels 437 are separately sealed with aluminum or stainless steel caps 438 (not shown in FIG. 4C) that are brazed or laser welded into place. Additionally, one or more fluid inlets 431 and fluid outlets 439 are formed in the bottom plate 430 fluidly coupling the temperature control channels 435 and/or cross-channels 436 through the supply channels 432 and return channels 437 to the heat exchanging system 270.

A heat exchanging fluid may be delivered from the heat exchanging system 270 to the one or more supply channels 432 through the one or more fluid inlets 431. The heat exchanging fluid then circulates through the temperature control channels 435 and/or cross-channels 436 and into the one or more return channels 437. The heat exchanging fluid then exits the showerhead 201 through the one or more fluid outlets 439 and returns to the heat exchanging system 270.

A diverter plate 440 is disposed between the middle plate 420 and the bottom plate 430 similar to that shown in and described with respect to FIG. 3A. FIG. 4D is a schematic, top view of the diverter plate 440 shown in FIG. 4A. The diverter plate 440 includes a plurality of first gas passages 442 disposed therethrough and aligned with the gas passages 424 and a number of the gas passages 433. The first gas passages 442 may be aligned in a plurality of rows matching the rows of the gas passages 424 in the middle plate 420. The rows of the first gas passages 442 may be further aligned with alternate rows of the gas passages 433 in the bottom plate 430.

Channels 444 are formed in the diverter plate 440 between adjacent rows of the first gas passages 442. A plurality of second gas passages 446 are formed through the diverter plate 440 within each of the channels 444, which are aligned with alternate rows of the gas passages 433 in the bottom plate 430. The channels 444 are divided into an inner region 462 and an outer region 464 by an annular wall 465 (FIG. 4D). The annular wall 465 may circumscribe an annular channel 467 formed in the diverter plate 440, which is in fluid communication with the channels 444 in the inner region 462. The diverter plate 440 also has one or more supply channels 468 formed therein for supplying a second processing gas from one or more first gas inlets 429 formed in the middle plate 420 and coupled to the chemical delivery module 203. The diverter plate 440 further includes a perimeter channel 448 disposed about the periphery of the diverter plate 440 in fluid communication with the channels 444 in the outer region 464 of the diverter plate 440. In addition, the middle plate 420 includes one or more second fluid inlets 428 disposed therethrough for delivering the same or a different second processing gas from the chemical delivery module 203 into the perimeter channel 448.

The middle plate 420 and the bottom plate 430 may be coupled together using a plurality of screws 312 or other suitable fasteners, engaging blind holes 316 in the bottom plate 430. The mating surfaces of the middle plate 420 and the bottom plate 430 may be machined so that when they are attached, a metal to metal seal is maintained between the middle plate 420 and the bottom plate 430 such that fluids entering the perimeter channel 448 is sealed about the periphery of the showerhead assembly 201. Alternatively, other sealing means are used to maintain the fluid seal, such as o-rings.

A second processing gas may be delivered by the chemical delivery module 203 into the perimeter channel 448 through the one or more second fluid inlets 428 at a first flow rate and/or pressure. The second processing gas is distributed from the perimeter channel 448 to the channels 444 in the outer region 464 and is delivered through the second plurality of gas passages 446 in the outer region 464. At the same time, the same or a different processing gas may be delivered by the chemical delivery module 203 to the one or more supply channels 468 through the one or more first gas inlets 429. The second processing gas is distributed from the supply channels 468 to the annular channel 467 and into the channels 444 in the inner region 462. The second processing gas is then delivered through the second plurality of gas passages 446 in the inner region 462. The second processing gas delivered to the outer region 464 and the inner region 462 may be the same or a different processing gas at a second flow rate and/or pressure different that the first flow rate and/or pressure.

The diverter plate 440 is sandwiched between the middle plate 420 and the bottom plate 430. The diverter plate 440 may be formed such that the mating surfaces between the diverter plate 440 and the middle plate 420 as well as the mating surface between the diverter plate 440 and the bottom plate 430 form a surface-to-surface seal, such that fluids delivered from the outer and inner gas manifolds 425, 426 through the first gas passages 442 are not mixed with fluids delivered to the outer and inner regions 464, 462 and through the second gas passages 446 prior to delivery to the respective gas passages 433 in the bottom plate 430. Alternatively, other sealing means are used to maintain the fluid seal, such as o-rings.

Referring to FIGS. 2 and 4A, a first processing gas, such as a metal organic precursor, may be delivered to the outer gas manifold 425 from the chemical delivery module 203 at a first flow rate and/or pressure. The first processing gas is then delivered from the outer gas manifold 425 through the plurality of gas passages 424 in the middle plate, and through the aligned first gas passages 442 in the diverter plate 440. The first processing gas is then delivered through the gas passages 433 in the bottom plate 430 that are aligned with the first gas passages 442 and into the processing volume 208.

At the same time, the first processing gas may be delivered to the inner gas manifold 426 from the chemical delivery module 203 at a second flow rate and/or pressure that is different from the first flow rate and/or pressure of the first processing gas delivered to the outer gas manifold 425. The first processing gas is then delivered from the inner gas manifold 426 through the plurality of gas passages 424 in the middle pate, and through the aligned first gas passages 442 in the diverter plate 440. The first processing gas is then delivered through the gas passages 433 in the bottom plate 430 that are aligned with the first gas passages 442 and into the processing volume 208. Thus, the first processing gas may be delivered to inner and outer regions of the processing volume 208 at different flow rates and/or pressures in order to provide finer control over substrate processing.

Substantially simultaneously, a second processing gas, such as a nitrogen precursor, may be delivered into the perimeter channel 448 from the chemical delivery module 203 through the one or more fluid inlets 428 at a first flow rate and/or pressure. The second processing gas is distributed from the perimeter channel 448 to the channels 444 in the outer region 464 of the diverter plate 440 and through the second plurality of gas passages 446 in the outer region 464 of the diverter plate 440. The second processing gas is then delivered through the gas passages 433 aligned with the second gas passages 446 in the outer region 464 and into the processing volume 208 without mixing with the first processing gas prior to delivery into the processing volume 208.

At the same time, the second processing gas may be delivered by the chemical delivery module 203 to the one or more supply channels 468 through the one or more first gas inlets 429 at a second flow rate and/or pressure that is different from the first flow rate and/or pressure of the second processing gas delivered to the perimeter channel 448. The second processing gas is then distributed from the supply channels 468 to the annular channel 467, into the channels 444 in the inner region 462, and through the second plurality of gas passages 446 in the inner region 462 of the diverter plate 440. The second processing gas is then delivered through the gas passages 433 aligned with the second gas passages 446 in the inner region 462 and into the processing volume 208 without mixing with the first processing gas or the second processing gas delivered through the outer region 464. Thus, the second processing gas may be delivered to inner and outer regions of the processing volume 208 at different flow rates and/or pressures in order to provide finer control over substrate processing.

At the same time the first and second processing gases are being delivered through the showerhead 201 and into the processing volume 208, a heat exchanging fluid may be delivered from the heat exchanging system 270 to the one or more supply channels 432 in the bottom plate 430. The heat exchange fluid then circulates through the temperature control channels 435 and/or cross-channels 436, cooling the first and second processing gases as well as the surface of the bottom plate 430 facing the processing volume 208. The heat exchanging fluid then exits the bottom plate 430 through the one or more return channels 437 and returns to the heat exchanging system 270.

Therefore, embodiments of the present invention provide a showerhead for introducing multiple processing gases without mixing the gases prior to exiting the showerhead. The showerhead has multiple plates fastened together using suitable fasteners rather than being brazed or welded. Manufacturing the showerhead by fastening the multiple plates rather than brazing allows for a simpler and more cost effective manufacturing process. In addition, one or more surface treatments or coatings may be applied to each of the plates during manufacturing, and the showerhead may be easily disassembled during cleaning/refurbishing processes to strip, clean, and/or reapply coatings as compared to a brazed or welded showerhead. Exemplary surface treatments may include bead blasting, grit blasting, and the like. Exemplary coatings may include alumina, zirconium oxide yttrium, yttrium oxide, chromium oxide, silicon carbide, and the like.

Although specific showerhead configurations are shown in FIGS. 3A-3C and 4A-4D, certain aspects of each configuration may be equally applicable to the other. For instance, the configuration shown and described with respect to FIGS. 3A-3C may include the multiple manifold configuration of FIGS. 4A-4D in order to provide separate delivery of precursor gases to inner and outer regions of the processing volume. In addition, the configuration shown in FIG. 3A may have the bottom plate 430 substituted for the bottom plate 330, or the configuration shown in FIG. 4A may have the bottom plate 330 substituted for the bottom plate 430.

Additionally, although the embodiments herein are generally described with respect to MOCVD and HVPE processes, the apparatus and methods described are equally applicable to other processes wherein multiple processing gases are introduced into a processing volume without mixing the gases prior to exiting the showerhead.

While the foregoing is directed to embodiments of the present invention, other and further embodiments of the invention may be devised without departing from the basic scope thereof, and the scope thereof is determined by the claims that follow.

The invention claimed is:

1. A showerhead assembly, comprising:
   a first plate;
   a second plate coupled to the first plate to form a gas manifold;
   a third plate coupled to the second plate and having one or more temperature control channels disposed therein, the one or more temperature control channels isolated from a processing volume and configured to circulate a heat exchanging fluid from an inlet formed in the third plate to an outlet formed in the third plate, wherein the third plate has a first plurality of gas passages and a second plurality of gas passages formed therethrough, the first plurality of gas passages and the second plurality of gas passages surrounded by the one or more temperature control channels; and
   a fourth plate disposed between the second plate and the third plate, wherein the fourth plate has a plurality of channels formed therein that are fluidly coupled to the second plurality of gas passages in the third plate, and wherein the fourth plate has a plurality of gas passages formed therethrough fluidly coupling the gas manifold with the first plurality of gas passages in the third plate, the fourth plate having a bottom surface exposed to the processing volume.

2. The assembly of claim 1, wherein the first, second, and third plates are coupled together using a plurality of mechanical fasteners.

3. The assembly of claim 1, wherein the gas passages in the fourth plate are isolated from the channels in the fourth plate.

4. The assembly of claim 1, wherein the fourth plate is comprises a polymeric material.

5. A showerhead assembly, comprising:
   a first plate;
   a second plate coupled to the first plate to form a gas manifold;
   a third plate coupled to the second plate and having one or more temperature control channels disposed therein, wherein the third plate has a first plurality of gas passages and a second plurality of gas passages formed therethrough, wherein the third plate comprises a fifth plate coupled to a sixth plate having a single temperature control channel disposed therebetween; and
   a fourth plate disposed between the second plate and the third plate, wherein the fourth plate has a plurality of channels formed therein that are fluidly coupled to the second plurality of gas passages in the third plate, and wherein the fourth plate has a plurality of gas passages formed therethrough fluidly coupling the gas manifold with the first plurality of gas passages in the third plate.

6. The assembly of claim 5, wherein the first and second gas passages comprise a plurality of fluid conduits coupled to the fifth and sixth plates.

7. The assembly of claim 6, wherein the plurality of fluid conduits are disposed through the temperature control channel.

8. The assembly of claim 1, wherein the third plate has a plurality of temperature control channels disposed between the first and second plurality of gas passages.

9. A showerhead assembly, comprising:
a first plate;
a second plate coupled to the first plate to form a plurality of gas manifolds;
a third plate coupled to the second plate and having one or more temperature control channels disposed therein, the one or more temperature control channels isolated from a processing volume and configured to circulate a heat exchanging fluid from an inlet formed in the third plate to an outlet formed in the third plate, wherein the third plate has a first plurality of gas passages and a second plurality of gas passages formed therethrough, the first plurality of gas passages and the second plurality of gas passages surrounded by the one or more temperature control channels; and
a fourth plate disposed between the second plate and the third plate, wherein the fourth plate has a plurality of channels formed therein that are fluidly coupled to the second plurality of gas passages in the third plate, and wherein the fourth plate has a plurality of gas passages formed therethrough fluidly coupling the plurality of gas manifolds with the first plurality of gas passages in the third plate, the fourth plate having a bottom surface exposed to the processing volume.

10. The assembly of claim 9, wherein the fourth plate has one or more walls separating the plurality of channels and the plurality of gas passages into two or more isolated regions.

11. The assembly of claim 10, wherein the two or more isolated regions include an inner region and an outer region.

12. The assembly of claim 11, wherein the inner region is concentrically disposed within the outer region.

13. The assembly of claim 9, wherein the first, second, and third plates are coupled together using a plurality of mechanical fasteners.

14. The assembly of claim 9, wherein the fourth plate is comprises a polymeric material.

15. A showerhead assembly, comprising:
a first plate;
a second plate coupled to the first plate to form a plurality of gas manifolds;
a third plate coupled to the second plate and having one or more temperature control channels disposed therein, wherein the third plate has a first plurality of gas passages and a second plurality of gas passages formed therethrough, wherein the third plate comprises a fifth plate coupled to a sixth plate having a single temperature control channel disposed therebetween; and
a fourth plate disposed between the second plate and the third plate, wherein the fourth plate has a plurality of channels formed therein that are fluidly coupled to the second plurality of gas passages in the third plate, and wherein the fourth plate has a plurality of gas passages formed therethrough fluidly coupling the plurality of gas manifolds with the first plurality of gas passages in the third plate.

16. The assembly of claim 15, wherein the first and second gas passages comprise a plurality of fluid conduits coupled to the fifth and sixth plates.

17. The assembly of claim 16, wherein the plurality of fluid conduits are disposed through the temperature control channel.

18. The assembly of claim 9, wherein the third plate has a plurality of temperature control channels disposed between the first and second plurality of gas passages.

19. A showerhead assembly, comprising:
a first plate;
a second plate coupled to the first plate to form a first gas manifold and a second gas manifold;
a third plate coupled to the second plate and having one or more temperature control channels disposed therein, the one or more temperature control channels isolated from a processing volume and configured to circulate a heat exchanging fluid from an inlet formed in the third plate to an outlet formed in the third plate, wherein the third plate has a first plurality of gas passages and a second plurality of gas passages formed therethrough, the first plurality of gas passages and the second plurality of gas passages surrounded by the one or more temperature control channels; and
a fourth plate disposed between the second plate and the third plate, wherein the fourth plate has a plurality of channels formed therein that are fluidly coupled to the second plurality of gas passages in the third plate, wherein the fourth plate has a plurality of gas passages formed therethrough fluidly coupled to the first plurality of gas passages in the third plate, the fourth plate having a bottom surface exposed to the processing volume, wherein the fourth plate has one or more walls separating the plurality of channels and the plurality of gas passages into a first region and a second region, and wherein the plurality of gas passages in the first region are fluidly coupled to the first gas manifold and the plurality of gas passages in the second region are fluidly coupled to the second gas manifold.

20. The assembly of claim 19, wherein the third plate has a plurality of temperature control channels disposed between the first and second plurality of gas passages.

* * * * *